US009006669B2

(12) United States Patent
Chiyoma et al.

(10) Patent No.: US 9,006,669 B2
(45) Date of Patent: Apr. 14, 2015

(54) RADIATION DETECTOR

(75) Inventors: Hitoshi Chiyoma, Otawara (JP); Hiroshi Iwata, Otawara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 734 days.

(21) Appl. No.: 12/782,074

(22) Filed: May 18, 2010

(65) Prior Publication Data

US 2010/0224785 A1 Sep. 9, 2010

Related U.S. Application Data

(63) Continuation of application No. PCT/JP2008/069954, filed on Oct. 31, 2008.

(30) Foreign Application Priority Data

Nov. 19, 2007 (JP) .................................. 2007-298864

(51) Int. Cl.
*G01T 1/208* (2006.01)
*G01T 1/20* (2006.01)
*H05K 1/14* (2006.01)

(52) U.S. Cl.
CPC .............. *G01T 1/2018* (2013.01); *H05K 1/147* (2013.01)

(58) Field of Classification Search
CPC ............................ G01T 1/2018; H05K 1/147
USPC .............................................. 250/369, 370.11
See application file for complete search history.

(56) References Cited

U.S. PATENT DOCUMENTS

| | | | | |
|---|---|---|---|---|
| 4,037,047 A | * | 7/1977 | Taylor ............................ | 174/254 |
| 6,495,836 B1 | * | 12/2002 | Hata ........................ | 250/370.09 |
| 2001/0033336 A1 | * | 10/2001 | Kameshima et al. ......... | 348/300 |
| 2002/0148967 A1 | * | 10/2002 | Iwanczyk et al. ........ | 250/370.11 |
| 2002/0148968 A1 | * | 10/2002 | Der Haar ................. | 250/370.11 |
| 2004/0211909 A1 | * | 10/2004 | Watanabe ................ | 250/370.11 |
| 2007/0029670 A1 | * | 2/2007 | Shibayama et al. .......... | 257/737 |

FOREIGN PATENT DOCUMENTS

| | | |
|---|---|---|
| JP | 08-116044 | 5/1996 |
| JP | 2002-022841 | 1/2002 |
| JP | 2003-035778 | 2/2003 |
| JP | 2003-163343 | 6/2003 |
| JP | 2004-165354 | 6/2004 |

OTHER PUBLICATIONS

All flex Inc. Design guide (2000), 14 pages.*
3M Anisotropic conductive film adhesive product selection guide (Jan. 2007), 13 pages.*
International Search Report for PCT/JP2008/069954.

* cited by examiner

*Primary Examiner* — David Porta
*Assistant Examiner* — Shun Lee
(74) *Attorney, Agent, or Firm* — Pillsbury Winthrop Shaw Pittman, LLP

(57) ABSTRACT

According to one embodiment, a radiation detector includes a photodetector including a fluorescent film configured to convert radiation into light, and a photoelectric conversion element configured to convert light into an electrical signal, a circuit board configured to electrically drives the photodetector, and electronically processes an output signal from the photodetector, and a connection board configured to electrically connect the photodetector and circuit board, and including a flexible circuit board, and an IC mounting board connected to the flexible circuit board, less flexible than the flexible circuit board, and including an IC semiconductor element.

4 Claims, 5 Drawing Sheets

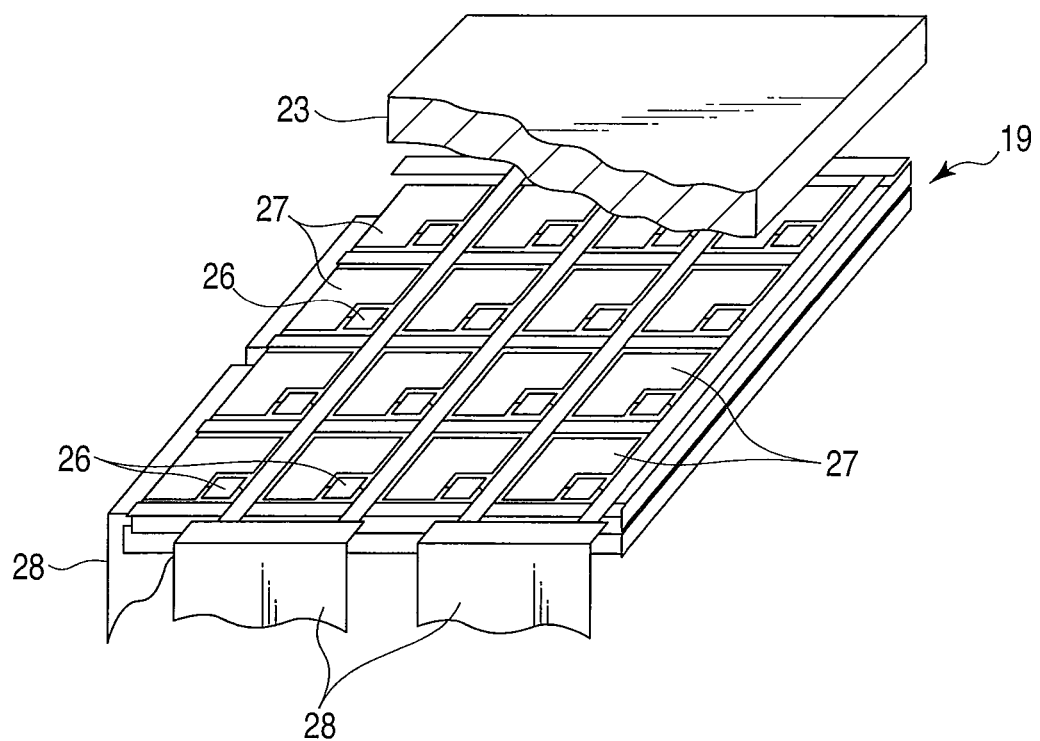
F I G. 6

RADIATION DETECTOR

CROSS REFERENCE TO RELATED APPLICATIONS

This is a Continuation Application of PCT Application No. PCT/JP2008/069954, filed Oct. 31, 2008, which was published under PCT Article 21(2) in Japanese.

This application is based upon and claims the benefit of priority from Japanese Patent Application No. 2007-298864, filed Nov. 19, 2007; the entire contents of which are incorporated herein by reference.

FIELD

Embodiments described herein relate generally to a radiation detector to detect radiation.

BACKGROUND

In recent years, a radiation detector, comprising a phosphor film to convert radiation, particularly X-rays into light, and a photoelectric conversion element to convert the light into an electric signal, has been practically used. Such a radiation detector can reduce the size and weight of radiological equipment. The radiation detector converts image data obtained by radiation passing through an object, into digital electronic data. The radiation detector has great convenience in digital data processing such as digital image processing and digital image storage.

The radiation detector has been used in a wide field including medical and dental uses which are used for diagnosis and treatment for patients, industrial use of nondestructive inspection, scientific inquiry of structural analysis, etc. Digital data processing enables precision image extraction and high-speed image detection in each field. The degree of undesired exposure to radiation can be reduced, and speedy inspection and diagnosis can be realized.

Scintillator technology is often used for a phosphor film of a radiation detector. A scintillator is made of material consisting mainly of Cs and I used for a conventional X-ray image tube. The scintillator material consisting mainly of cesium iodine (CsI) and forming a columnar crystal can improve sensitivity and resolution by an optical guide effect, compared with other scintillator materials forming a particulate crystal.

A conventional X-ray image tube needs an electronic lens in a vacuum tube, and increases the size and weight. However, a thin two-dimensional radiation detector is possible by making a photodetector having a photoelectric conversion element of a thin-film element using amorphous silicon.

A photodetector and a circuit board, for example, are arranged in parallel to each other so as to realize an advanced thin lightweight radiation detector. A phosphor film is used in the photodetector. The circuit board electrically drives the photodetector, and electrically processes an output signal from the photodetector.

A flexible circuit board connects the photodetector and circuit board. The flexible circuit board is provided with a shift register, and an integrated-circuit (IC) semiconductor element for detecting a signal. The above technique of reducing the whole size of a radiation detector is disclosed in Jpn. Pat. Appln. KOKAI Publication No. H8-116044 (page 33, FIG. 52).

On the other hand, the radiation detector has been improved in the performance. Particularly, a power supply noise is reduced to improve the output signal stability and signal-to-noise ratio. For example, a low-pass filter is connected to each reference power supply. Such a technique intends to reduce a random noise in each reference voltage, and to prevent fluctuations and degradation of signal-to-noise ratio in an output signal caused by noise in such reference voltages. The technique is disclosed in Jpn. Pat. Appln. KOKAI Publication No. 2003-163343 (pages 3-4, FIG. 1).

The above described conventional technology causes the following problems.

The flexible circuit board is highly flexible, and effective for electrical connection between parallel-connected photodetector and circuit board. However, a local stripping stress may occur in the electrical connection part of the signal detection IC semiconductor element mounted on the flexible circuit board. Therefore, the flexible circuit board may raise a problem such as stripping, which degrades the reliability of the electrical connection part.

Further, as the flexible circuit board is highly flexible, the signal detection IC semiconductor element is likely to move when an external force is applied to the radiation detector. The larger the mass of the signal detection IC semiconductor element, the vibration or shock is greater. When a great vibration or shock occurs, the electrical connection part is mechanically damaged.

Further, when a vibration occurs in the radiation detector, the flexible circuit board is easy to be deformed. The deformed flexible circuit board causes a fluctuation in the floating capacitance of the electrical traces on the flexible circuit board. As a result, noise occurs in the reference power supply voltage, input signal, and output signal of the signal detection IC semiconductor element mounted on the flexible circuit board. Therefore, the radiation detector cannot display full performance even if a noise protective measure is taken for the circuit.

The flexible circuit board provided with a signal detection IC semiconductor element is contracted in the form of a tape carrier package (TCP) or chip on film (COF). Thus, other electronic parts such as a capacitor cannot be arranged or mounted close to the signal detection IC semiconductor element on the flexible circuit board. These electronic parts are used for generating a reference potential necessary for the signal detection IC semiconductor element. This increases a noise in the voltage or signal.

A multilayer structure is problematic with respect to the traces for a power supply, grounding, a reference potential, a control signal, and a detection signal. These traces are arranged in parallel on a flat surface. The trace for a detection signal is susceptible to noise, and is likely to permit noise.

Impedance is high in the traces for a power supply and grounding in the signal detection IC semiconductor element. Thus, the power supply voltage is decreased in an input terminal part of the signal detection IC semiconductor element. This may affect an offset of grounding, and fixed noise.

BRIEF DESCRIPTION OF THE DRAWINGS

FIG. 6 is an exploded perspective view of a part of the X-ray detector, showing an X-ray detection panel with a part broken away in the embodiment.

DETAILED DESCRIPTION

In general, according to one embodiment, there is provided a radiation detector comprising: a photodetector comprising a fluorescent film configured to convert radiation into light, and a photoelectric conversion element configured to convert light into an electrical signal; a circuit board configured to electrically drives the photodetector, and electronically processes an output signal from the photodetector; and a connection board configured to electrically connect the photodetector and circuit board, and comprising a flexible circuit board, and an IC mounting board connected to the flexible circuit board, less flexible than the flexible circuit board, and comprising an IC semiconductor element.

Hereinafter, an embodiment will be explained with reference to the accompanying drawings.

Figure 1:
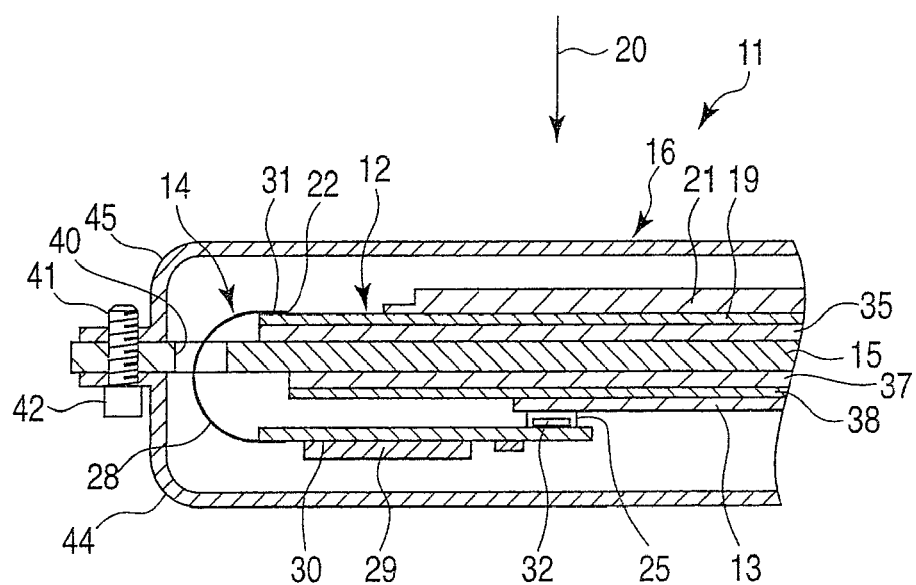
FIG. 1 is a sectional view showing a part of an X-ray detector according to an embodiment.

FIG. 1 is a sectional view showing a part of an X-ray detector 11 as a radiation detector, according to an embodiment. The X-ray detector 11 comprises an X-ray detection panel 12 as a radiation detection panel, a circuit board 13, a connection board 14, a support substrate 15, and a casing 16. The circuit board 13 electrically drives the X-ray detection panel 12 (photodetector), and electrically processes an output signal from the X-ray detection panel 12. The connection board 14 connects the X-ray detection panel 12 and circuit board 13. The support substrate 15 supports the X-ray detection panel 12 and circuit board 13. The casing 16 houses parts of the X-ray detection panel 12, circuit board 13, connection board 14, and a part of the support substrate 15.

Figure 2:
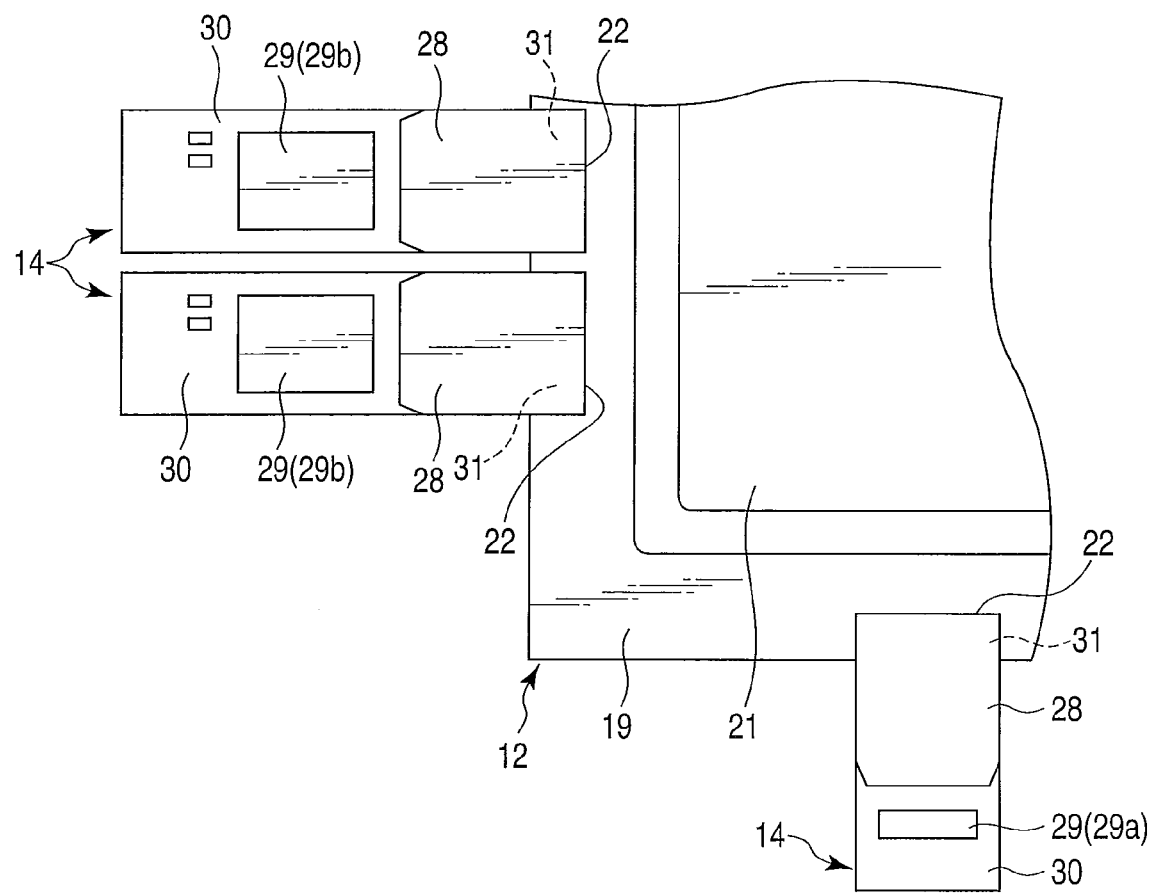
FIG. 2 is a development view showing a part of a photodetector and a connection board of the X-ray detector in the embodiment.

As shown in FIGS. 1 and 2, the X-ray detection panel 12 comprises a photodetector 19, a fluorescent film 23, and a moisture-proof cover 21. The fluorescent film 23 is formed on the X-ray input side of the photodetector 19. The moisture-proof cover 21 covers the fluorescent film 23, and is sealed to the fluorescent film 23.

As shown in FIG. 6, the photodetector 19 comprises a plurality of thin-film transistors (TFT) 26 and photodiodes (PD) 27 provided as photoelectric conversion elements on a 0.7-mm-thick glass substrate. The TFT 26 and PD 27 are made by using amorphous silicon (a-Si) as a base material. The fluorescent film 23 converts an X-ray 20 as radiation into light. The PD 27 converts the light converted by the fluorescent film 23 into an electrical signal.

As shown in FIG. 2, a plurality of terminal pads 22 for connecting the photodetector 19 to the outside is formed in the outer circumference of the photodetector 19. The terminal pads 22 are used to input an electrical signal for driving the photodetector 19, and to output an output signal from the photodetector 19.

As shown in FIG. 1, the circuit board 13 electrically drives the photodetector 19, and electrically processes an output signal from the photodetector 19. A connector 25 for electrically connecting the connection board 14 is provided in the outer circumference of the circuit board 13.

As shown in FIGS. 1, 2, 3A, 3B and 3C, the connection board 14 comprises a flexible circuit board 28 with only traces provided, and an IC mounting board 30 with an IC semiconductor element 29 mounted. The IC mounting board 30 is less flexible than the flexible circuit board 28. The connection board 14 is constituted by connecting one end of the flexible circuit board 28 to one end of the IC mounting board 30.

The flexible circuit board 28 is provided with a trace pattern made of a copper film on a polyimide film, for example. The flexible circuit board 28 is highly flexible circuit board. On the front side or the other end side of the flexible circuit board 28, a trace pattern is exposed, and a connection part 31 is formed in the exposed area of the trace pattern. The connection part 31 ensures the stability of electrical connection, and the exposed area is gold plated. The connection part 31 of the flexible circuit board 28 is connected to the terminal pads 22 of the photodetector 19. The connection part 31 and terminal pads 22 are connected by thermocompression bonding, using an anisotropic conductive film (ACF). This connection method ensures electrical connection of minute signal lines.

The IC mounting board 30 is a rigid multilayer circuit substrate formed by laminating a multilayer copper film on a glass epoxy material, for example. The IC mounting board 30 is mounted with the IC semiconductor element 29 one side thereof, and connected to one end of the flexible circuit board 28. A connector 32 is provided on the other side of the IC mounting board 30. The connector 32 is electrically connected to the connector 25 of the circuit board 13. The IC mounting board 30 is fixed to the circuit board 13 through the connector 32. Therefore, the IC mounting board 30 and circuit board 13 are electrically connected by a connector method.

The IC mounting board 30 and circuit board 13 are definitely positioned. The IC mounting board 30 is fixed at predetermined positions in the casing 16. The IC mounting board 30 is a multilayer circuit board. Therefore, the trace structure of the IC mounting board 30 enables appropriate terminal connections to the IC semiconductor element 29, flexible circuit board 28, and circuit board 13.

As the IC semiconductor element 29, an IC semiconductor element 29a for driving the photodetector 19 and an IC semiconductor element 29b for detecting a signal are used. The photodetector-driving IC semiconductor element 29a electrically drives the photodetector 19. The signal detection IC semiconductor element 29b processes an output signal from the photodetector 19. The signal detection IC semiconductor element 29b has a function of amplifying a minute output signal from the photodetector 19.

Figure 4:
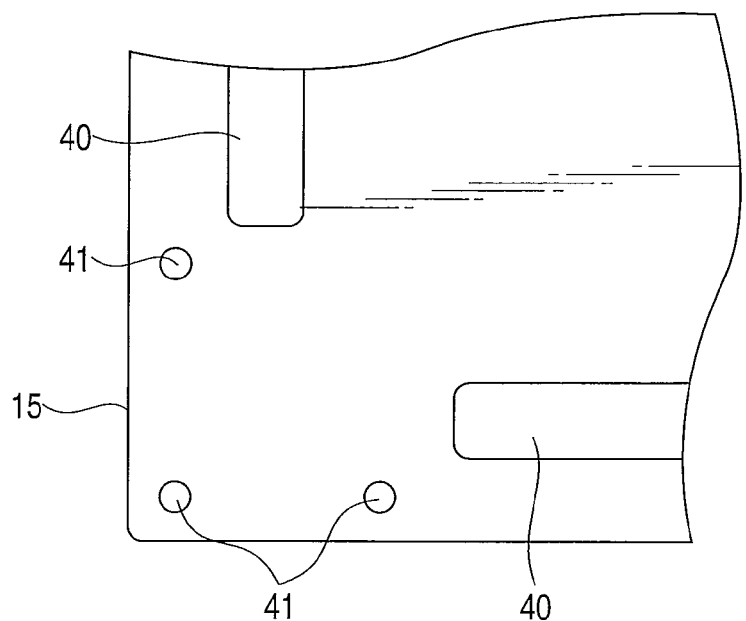
FIG. 4 is a front view showing a part of a support substrate of the X-ray detector in the embodiment.

The support substrate 15 is made of aluminum alloy, for example. The photodetector 19 of the X-ray detection panel 12 is attached on one face of the support substrate 15 through a sticking gel sheet 35 as a gel material. The circuit board 13 is attached on the other face of the support substrate 15 through an X-ray shielding lead plate 37 and a radiating/insulating sheet 38. Further, as shown in FIGS. 1 and 4, openings 40 are provided in the vicinity of the outer circumference of the support substrate 15. The flexible circuit board 28 of the connection board 14 connecting the photodetector 19 of the X-ray detection panel 12 and the circuit board 13 passes through the opening 40. A plurality of mounting holes 41 is provided at a corner of the support substrate 15.

Further, as shown in FIG. 1, the casing 16 comprises cover parts 44 and 45. The peripheral edge portion of the support substrate 15 is held between the peripheral edge portions of the cover parts 44 and 45. The peripheral edge portion of the support substrate 15, and the peripheral edge portions of the cover parts 44 and 45 are fixed by an anchor 42. The anchor 42 is a fixing screw, for example, inserted into the mounting hole 41 of the support substrate 15. The anchor 42 may consist of a nut and a bolt penetrating through the mounting hole 41.

Next, a procedure of constructing the X-ray detector 11 will be briefly explained.

Figure 3A:
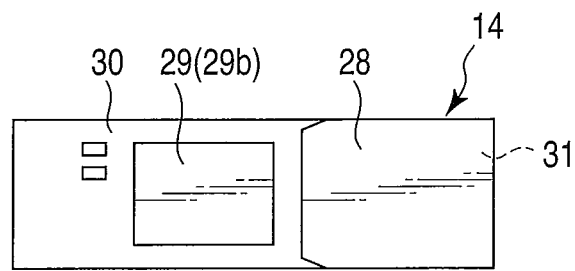
FIG. 3A is a front view showing the connection board of the X-ray detector in the embodiment.
Figure 3B:
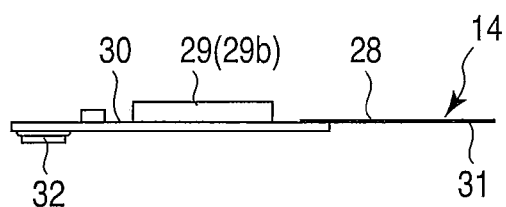
FIG. 3B is a side view of the connection board shown in FIG. 3A in the embodiment.
Figure 3C:
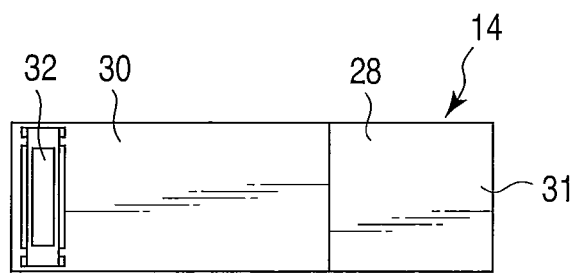
FIG. 3C is a rear view of the connection board shown in FIG. 3A in the embodiment.

First, the IC semiconductor element 29 is bump connected on the IC mounting board 30 by reflow soldering, thereby forming the connection board 14 shown in FIGS. 3A, 3B and 3C.

Then, as shown in FIG. 2, the connection part 31 of the flexible circuit board 28 is fixed to the terminal pads 22 of the photodetector 19 by thermocompression bonding through ACF. ACF is composed of an adhesive component and conductive filler. By the thermocompression bonding, the adhesive component is hardened while the conductive filler is electrically conducting predetermined terminals of the connection part 31 and terminal pads 22, thereby establishing electrical connection.

Usually, the connection board 14 provided with the photodetector-driving IC semiconductor element 29a and the connection board 14 provided with the signal detection IC semiconductor element 29b are separately manufactured. Two connection boards 14 are fixed to the photodetector 19 by thermocompression bonding.

As described above, the X-ray detection panel 12 fixed to the connection board 14 is attached to the support substrate 15 by using the gel sheet 35. At this time, each connection board 14 is passed through the opening 40 of the support substrate 14 and exposed to the opposite face of the support substrate 15. The lead plate 37 is previously fixed to the support substrate 15.

Next, the circuit board 13 is fixed to the lead plate 37 with screws on the opposite face of the support substrate 15 through the radiating/insulating sheet 38. On the circuit board 13, a plurality of connectors 25 are mounted corresponding to a plurality of connection boards 14. The connector 32 of each connection board 14 is connected to each connector 25 of the circuit board 13. Therefore, the X-ray detection panel 12, the IC semiconductor element 29 on the connection board 14, and the circuit board 13 are electrically connected.

The peripheral edge portion of the support substrate 15 is held between the peripheral edge portions of the cover parts 44 and 45. Finally, the peripheral edge portions of the cover parts 44 and 45 are fixed to the peripheral edge portion of the support substrate 15 by the anchor 42. The casing structure of the X-ray detector 11 is now completed.

The IC mounting board 30 of the connection board 14 has rigidity, and terminal connections to the mounted IC semiconductor element 29 can be stably and uniformly established. Further, when an external stress is applied to the connection board 14, the rigid IC mounting board 30 functions as a protector, and a direct load to the terminal connection between the IC mounting board 30 and the IC semiconductor element 29 is reduced. For example, a stripping force likely to be produced in the flexible circuit board 28 is greatly decreased. As a result, the reliability of the terminal connection between the connection board 14 and the IC semiconductor element 29 can be greatly improved.

Figure 5A:
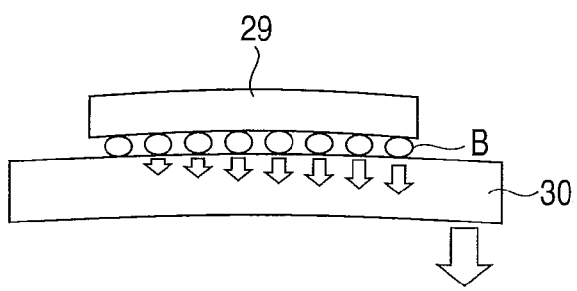
FIG. 5A is a schematic diagram for explaining improvement of the reliability of the X-ray detector against an external stress, showing a connection board with an IC semiconductor element mounted on an IC mounting board in the embodiment.
Figure 5B:
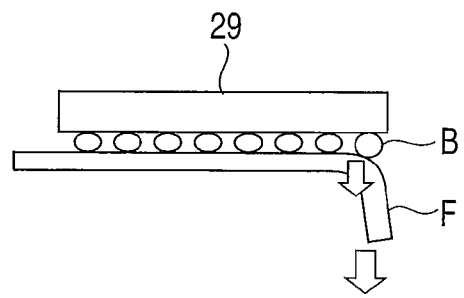
FIG. 5B is a schematic diagram for explaining improvement of the reliability of the X-ray detector against an external stress, equivalent to a comparative example with an IC semiconductor element mounted on a flexible circuit board.

FIGS. 5A and 5B are schematic diagrams for explaining improvement of the reliability of the X-ray detector 11 against an external stress. FIG. 5A is a schematic diagram showing the connection board 14 with the IC semiconductor element 29 mounted on the IC mounting board 30. FIG. 5B is a schematic diagram showing the connection board equivalent to a comparative example with the IC semiconductor element 29 mounted on a flexible circuit board F.

As shown in FIG. 5B, the flexible circuit board F is flexible with a low rigidity. The flexible circuit board F can be largely bent against a small bending stress. Therefore, a part of a stripping force is concentrated on each terminal and bump B connecting the flexible circuit board F and IC semiconductor element 29. As a result, the terminals and bump B tend to break.

In contrast, as shown in FIG. 5A, the IC mounting board 30 is rigid, and has a large curvature. Therefore, even if a stripping force (a bending stress) is applied to the IC mounting board 30, the force is distributed to the terminals and bumps connecting the IC mounting board 30 and IC semiconductor element 29. Therefore, the terminals and bumps B are prevented from breaking, thereby greatly improving the reliability.

The IC mounting board 30 of the connection board 14 is fixed at a predetermined position. In this example, the IC mounting board 30 is fixed to the circuit board 13 through the connectors 25 and 32, and the position of the IC mounting board 30 is fixed. This prevents fluctuations of floating capacity in the signal traces and reference potential supply trace on the IC mounting board 30, the circuit board 13, and the casing 16. Therefore, the output signal stability and signal-to-noise ratio can be improved.

As described above, the connection board 14 connecting the photodetector 19 and circuit board 13 comprises the connected flexible circuit board 28, and the IC mounting board 30 provided with the IC semiconductor element 29 connected to each other. By using the flexibility of the flexible circuit board 28, the size of the X-ray detector 11 can be reduced. By mounting the IC semiconductor element 29 on the rigid IC mounting board 30, the connection reliability can be improved. A noise factor caused by the connection board 14 can be controlled. Therefore, the output signal stability and signal-to-noise ratio can be improved.

While certain embodiments have been described, these embodiments have been presented by way of example only, and are not intended to limit the scope of the inventions. Indeed, the novel systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, an X-ray detector may comprise a plurality of circuit boards 13. In other words, an X-ray detector may comprise at least one circuit board 13, which electrically drives the photodetector 19 and electrically processes an output signal from the photodetector 19.

The present invention is not limited to an X-ray detector and applicable to any kind of radiation detector.

What is claimed is:
1. A radiation detector comprising:
 a fluorescent film configured to convert radiation into light;
 a photodetector comprising a photodiode and a thin-film transistor, the photodiode configured to convert the light into an electrical signal;
 a first circuit board configured to electrically drive the photodetector and electronically process an output signal from the photodetector;
 a connection board configured to electrically connect the photodetector and the first circuit board;
 the connection board including:

(a) flexible circuit board, and
(b) an IC mounting board that is connected to the flexible circuit board, the IC mounting board having rigidity and being less flexible than the flexible circuit board, the IC mounting board including:
(c) an IC semiconductor element that is bump-connected onto the IC mounting board, and
(d) a connector; and
a casing configured to house the photodetector, the first circuit board, and the connection board,
wherein the flexible circuit board comprises one end which is electrically connected to the photodetector using an anisotropic conductive film and another end which is electrically connected to the IC mounting board, and is bent inside the casing, and
wherein the IC mounting board is electrically connected to the first circuit board and fixed at a predetermined position in the casing, using the connector.

2. The radiation detector according to claim ,1 wherein the IC semiconductor element includes a signal detection semiconductor element having an electrical amplification function.

3. The radiation detector according to claim 1, wherein the IC semiconductor element includes a photodetector driving element to drive the photodetector .

4. The radiation detector according to claim 1, wherein the IC mounting board is a multilayer circuit board with a trace configuration that facilitates electrical connectivity between the IC semiconductor element, the flexible circuit board, and the first circuit board.

* * * * *